US006567964B2

(12) United States Patent
Shin et al.

(10) Patent No.: US 6,567,964 B2
(45) Date of Patent: May 20, 2003

(54) CONTINUOUSLY VARIABLE DUMMY PATTERN DENSITY GENERATING SYSTEMS, METHODS AND COMPUTER PROGRAM PRODUCTS FOR PATTERNING INTEGRATED CIRCUITS

(75) Inventors: Jae-pil Shin, Kyungki-do (KR);
Kwang-jai Yoo, Kyungki-do (KR);
Sang-ho Park, Kyungki-do (KR);
Moon-hyun Yoo, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 27 days.

(21) Appl. No.: 09/927,124

(22) Filed: Aug. 10, 2001

(65) Prior Publication Data

US 2002/0116686 A1 Aug. 22, 2002

(30) Foreign Application Priority Data

Feb. 21, 2001 (KR) .......................................... 2001-8757

(51) Int. Cl.[7] ............................................... G06F 17/50
(52) U.S. Cl. ............................... 716/8; 716/11; 716/10
(58) Field of Search ......................... 716/1–21; 438/618

(56) References Cited

U.S. PATENT DOCUMENTS

| 5,278,105 | A | * | 1/1994 | Eden et al. ................. 438/129 |
| 5,847,421 | A | | 12/1998 | Yamaguchi |
| 5,923,563 | A | * | 7/1999 | Lavin et al. .................. 716/19 |
| 6,093,631 | A | * | 7/2000 | Jaso et al. ................... 438/618 |
| 6,384,464 | B1 | * | 5/2002 | Shin ........................... 257/503 |
| 6,396,158 | B1 | * | 5/2002 | Travis et al. ................. 257/784 |
| 2002/0033488 | A1 | * | 3/2002 | Kawashima et al. ........ 257/202 |
| 2002/0063335 | A1 | * | 5/2002 | Ozawa et al. ............... 257/758 |
| 2002/0073391 | A1 | * | 6/2002 | Yamauchi et al. ............. 716/8 |

FOREIGN PATENT DOCUMENTS

| KR | P1998-071574 | 10/1998 |
| KR | P1999-029853 | 4/1999 |

OTHER PUBLICATIONS

Notice to Submit Response, KR Application No. 10-2001-0008757, Aug. 27, 2002.

* cited by examiner

Primary Examiner—Matthew Smith
Assistant Examiner—Magid Y Dimyan
(74) Attorney, Agent, or Firm—Myers Bigel Sibley & Sajovec

(57) ABSTRACT

Dummy patterns are generated for a region of an integrated circuit that is divided into buckets by obtaining a local pattern density for a respective bucket and adjusting a density of the dummy pattern for the respective bucket as a continuously variable function of the respective local pattern density and a target density for the region. By providing a continuously variable dummy pattern density, the desired density of the dummy pattern group may be adjusted precisely, to thereby reduce or eliminate loading effects. The density of the dummy pattern for the respective bucket may be calculated according to a formula in which the density of the dummy pattern is continuously variable. The dummy patterns may include features of fixed pitch and a size of the features of fixed pitch is increased or decreased as a continuously variable function of the respective local pattern density and the target density for the region.

30 Claims, 10 Drawing Sheets

CONTINUOUSLY VARIABLE DUMMY PATTERN DENSITY GENERATING SYSTEMS, METHODS AND COMPUTER PROGRAM PRODUCTS FOR PATTERNING INTEGRATED CIRCUITS

RELATED APPLICATION

This application claims the benefit of Korean Patent Application No. 2001-8757, filed Feb. 21, 2001, the disclosure of which is hereby incorporated herein by reference in its entirety as if set forth fully herein.

FIELD OF THE INVENTION

This invention relates to the design, layout, testing and manufacture of integrated circuits, and more particularly to systems, methods and computer program products for generating mask data for integrated circuits.

BACKGROUND OF THE INVENTION

Integrated circuits are widely used in consumer and commercial applications. As is well known to those having skill in the art, integrated circuits generally include multiple layers in and/or on an integrated circuit substrate. These layers may include semiconductors, conductors, insulators and/or combinations of these and/or other materials. The layer may be fabricated, for example, by blanket forming a layer and then patterning the blanket-formed layer. The layer may be blanket formed using sputtering, deposition, spin coating and/or other conventional methods. Patterning may be performed by transferring patterns that are defined in a physical design or layout to the actual physical layer. The physical designs may be represented by computer data corresponding to two-dimensional shapes. The transfer may occur by generating a mask or reticle having a desired pattern therein, transferring the pattern to a photoresist, and then patterning the layer using the photoresist as a mask. Other techniques may use direct writing of photoresist, for example using an electron beam. Many other layer-forming techniques also may be used.

It is known that the results of a fabrication process may be impacted by the specific design patterns that are being transferred to a layer. For example, a local pattern density of a physical design can impact the shapes and/or dimensions of the features that are being patterned in the layer. In particular, when an area occupied by a desired pattern on an integrated circuit substrate is small, more etch time may be needed compared to when the area is occupied by a pattern that is large. This phenomena is referred to as a "loading effect". When more etch time is used, the photoresist may be overetched while patterning the layer, and the line width of the layer to be patterned may become smaller than the desired line width. The loading effect may reduce the manufacturing yield of the integrated circuit and/or produce other undesired results. The loading effect is described, for example, in U.S. Pat. No. 5,278,105 to Eden et al., the disclosure of which is hereby incorporated herein by reference in its entirety as if set forth fully herein.

In an attempt to reduce the loading effect, it is known to provide dummy features in a layer of an integrated circuit. Thus, for example, the above-cited U.S. Pat. No. 5,278,105 to Eden et al. describes a design and method for fabricating devices with reduced loading effect. The disclosed design creates dummy features to increase the percentage of material remaining after etch of an active layer. This improves device reliability by preventing resist punch through during etch. Also, yields are improved as no devices are sacrificed to increase the percentage material remaining. Since dummy features are placed on all devices fabricated in a single production process, the percentage material remaining after etch is the same for all devices for a given layer. This allows the same recipe to be used for all devices fabricated by the process, thereby increasing throughput. See the Eden et al. abstract.

It is also known to provide variable density of dummy features, also referred to as "fill shapes" or "dummy patterns", in order to accommodate a wide range of pattern density variations. For example, U.S. Pat. No. 5,923,563 to Lavin et al. describes a method for adding fill shapes to a chip in a manner which accommodates a wide range of within-chip pattern density variations and provides a tight pattern density control (i) within a chip and (ii) from chip to chip. A grid is imposed over a chip design pattern, wherein each section of the grid contains a portion of the chip design. A pattern density is then determined for each section of the grid, based on that portion of the chip design pattern which lies within the particular grid section. The results of the pattern density determination are used to determine where to place fill shapes in the chip design in order to increase a density value in each section of the grid to that of a target density value. A best fit approximation is provided to the desired pattern density consistent with a set of layout rules for the level being patterned. See the Lavin et al. abstract. Lavin et al. also discloses a technique to provide variable density fill shape generation by calculating a pattern density for the fill pattern, which is then used as an index into a lookup table, to select one of three fill patterns—dense, medium or low—to fill the grid section. See Lavin et al. Column 5, lines 9–48. The disclosure of the Lavin et al. patent is hereby incorporated herein by reference in its entirety as if set forth fully herein.

SUMMARY OF THE INVENTION

Embodiments of the present invention generate dummy patterns for a region of an integrated circuit that is divided into a plurality of buckets by obtaining a local pattern density for a respective bucket and adjusting a density of the dummy pattern for the respective bucket as a continuously variable function of the respective local pattern density and a target density for the region. By providing a continuously variable dummy pattern density, the desired density of the dummy pattern group may be adjusted precisely, to thereby reduce or eliminate loading effects.

According to some embodiments of the invention, the density of the dummy pattern for the respective bucket is adjusted according to a formula in which the density of the dummy pattern is continuously variable. According to other embodiments, the dummy patterns includes a plurality of features of fixed pitch and a size of the features of fixed pitch is increased or decreased as a continuously variable function of the respective local pattern density and the target density for the region. In other embodiments, the features of fixed pitch comprise quadrangles of fixed pitch, and the length of at least one side of the quadrangles of fixed pitch is increased or decreased as a continuously variable function of the respective load pattern density and the target density for the region. In still other embodiments, the features of fixed pitch comprise rectangles of fixed pitch, and the length of at least one side of the rectangles of fixed pitch is adjusted as a continuously variable function of a square root of a difference between the respective local pattern density and the target density for the region, multiplied by an area of the dummy pattern in the respective bucket, divided by a number of dummy patterns in the respective bucket.

According to other embodiments of the present invention, the local pattern density is obtained for a respective bucket, by reading integrated circuit design layout data for the region of the integrated circuit from an integrated circuit design layout database. The integrated circuit design layout data for the region of the integrated circuit is divided into the plurality of buckets. The local pattern density is calculated for a respective one of the buckets. Finally, the dummy region is determined for a respective one of the buckets.

According to yet other embodiments of the invention, after adjusting the density of the dummy pattern for the respective bucket, the dummy pattern for the respective bucket is merged with the integrated circuit design layout data for the respective bucket. Then, the dummy pattern and the integrated circuit design layout data for the buckets is converted into mask data for patterning the region of the integrated circuit.

According to still other embodiments of the invention, the dummy region for the respective bucket is determined by adding at least one guard band around the integrated circuit design layout data for the region of the integrated circuit in the respective buckets, to thereby define a blocked region in the respective buckets. The dummy region then is defined as the respective bucket, except for the respective blocked region.

Finally, in other embodiments of the invention, the dummy pattern for a respective bucket is selected from a plurality of dummy patterns. The density of the dummy pattern for the respective bucket that is selected from the plurality of dummy patterns, is adjusted as a continuously variable function of the respective local pattern density and a target density for the region.

It will be understood that embodiments of the present invention may be provided as systems, methods and/or computer program products.

DETAILED DESCRIPTION OF PREFERRED EMBODIMENTS

Figure 1:
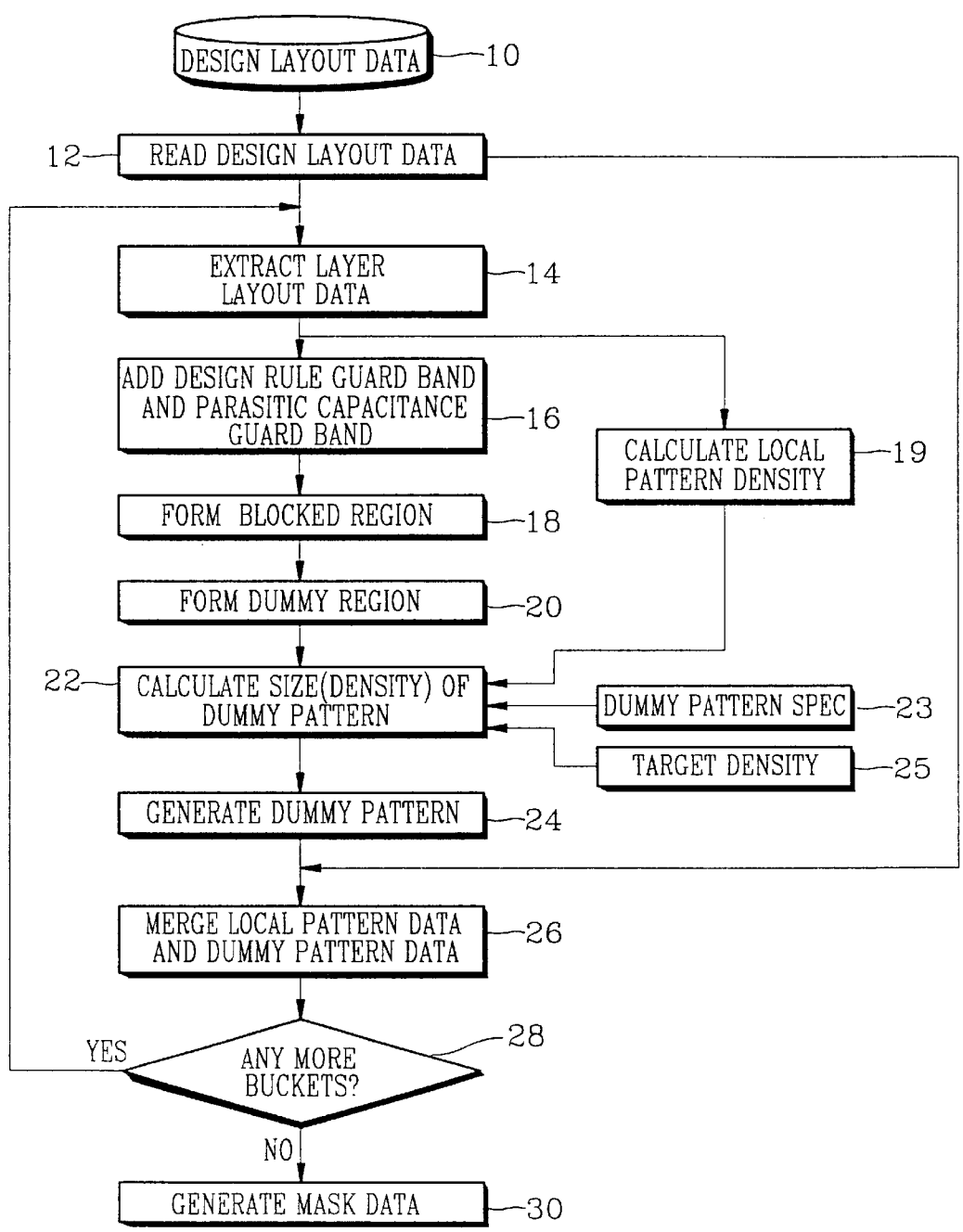
FIG. 1 is a flowchart of operations for generating dummy patterns for a region of an integrated circuit, according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present.

The operations of the present invention, as described more fully hereinbelow, may be performed by an entirely hardware embodiment, an entirely software embodiment or an embodiment combining software and hardware aspects. Furthermore, the present invention may take the form of a computer program product on a computer-readable storage medium having computer-readable program code embodied in the medium. Any suitable computer-readable medium may be utilized including hard disks, CD-ROMs and/or other optical or magnetic storage devices and wired and/or wireless transmission media. Like numbers refer to like elements throughout.

The present invention will be described below with reference to block diagrams and/or flowchart illustrations of methods, apparatus (systems) and/or computer program products according to embodiments of the invention. It is understood that each block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means for implementing the functions specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function specified in the block diagrams and/or flowchart block or blocks.

The computer program instructions may also be loaded onto a computer or other programmable data processing apparatus to cause a series of operational steps to be performed on the computer or other programmable apparatus to produce a computer implemented method such that the instructions which execute on the computer or other programmable apparatus provide steps for implementing the functions specified in the block diagrams and/or flowchart block or blocks. It should also be noted that in some alternative implementations, the functions noted in the blocks may occur out of the order noted in the flowcharts. For example, two blocks shown in succession may in fact be executed substantially concurrently or the blocks may sometimes be executed in the reverse order, depending upon the functionality involved.

Figure 2:
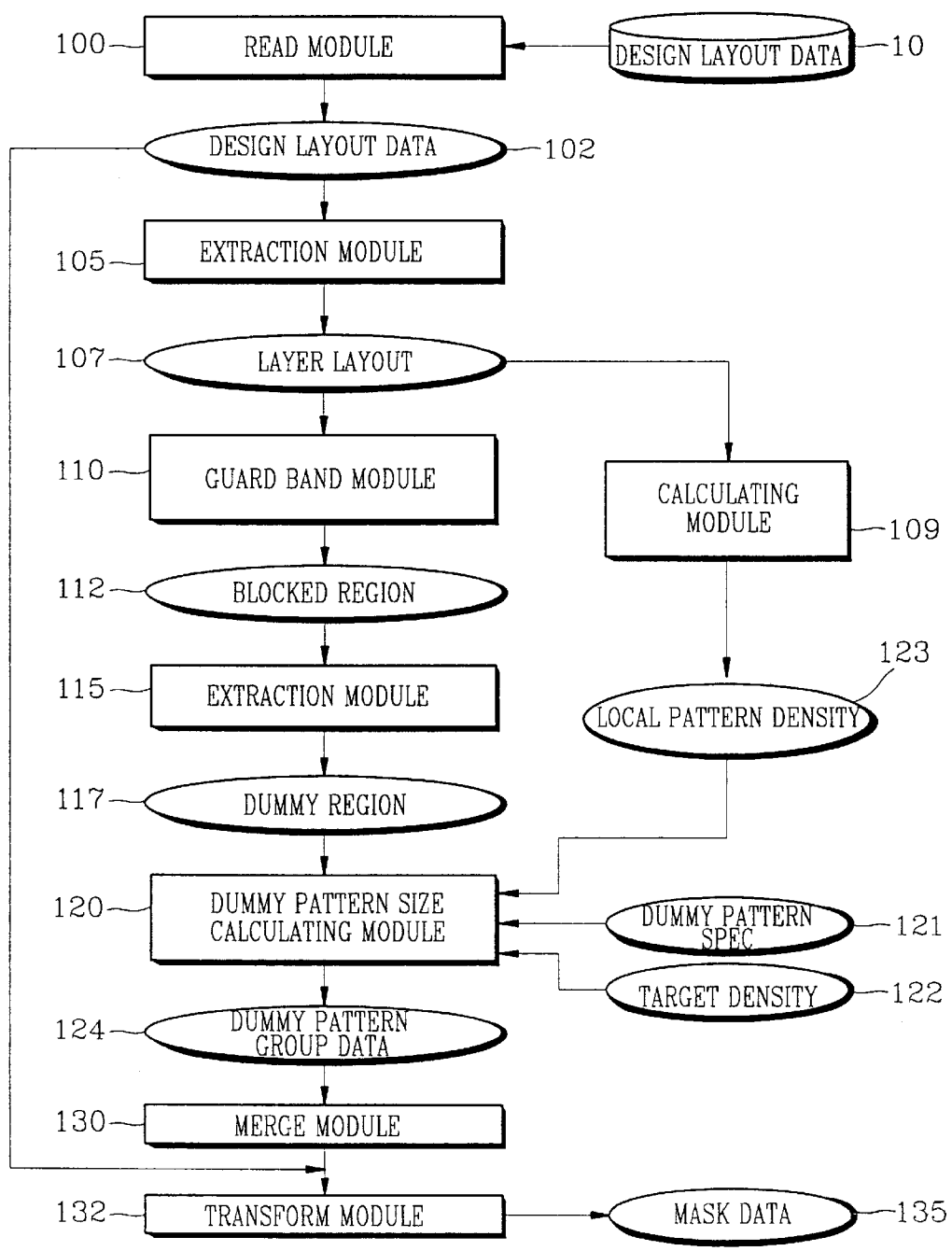
FIG. 2 is a flowchart of modules for generating dummy patterns for a region of an integrated circuit, according to embodiments of the present invention.

FIGS. 1 and 2 are flowcharts illustrating generating dummy patterns for a region of an integrated circuit according to embodiments of the present invention. FIG. 1 represents operations that may be performed according to embodiments of the invention, whereas FIG. 2 represents modules that may be used to process data according to embodiments of the invention. Embodiments of the invention now will be described using both FIGS. 1 and 2.

Figure 3:
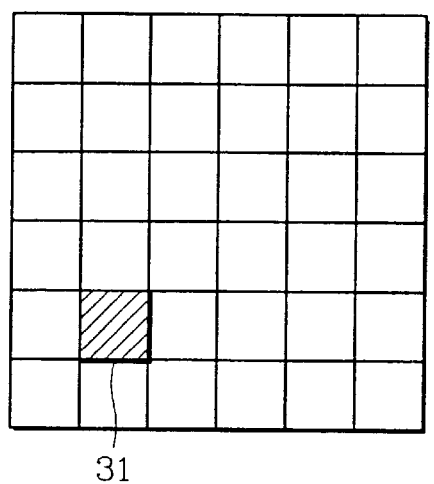
FIG. 3 is a top view of an integrated circuit that is divided into a plurality of buckets, according to embodiments of the present invention.

Referring now to FIGS. 1 and 2, conductive and/or insulating layers of an integrated circuit, such as a diffusion layer, a polysilicon layer and/or a metal wiring layer are laid out in a predetermined region of an integrated circuit chip, using conventional techniques. The layout data is stored in a chip design layout database 10. A chip design layout read module 100 (FIG. 2) obtains chip design layout data 102 from the chip design layout database 10 at Block 12 (FIG. 1). In FIG. 2, the chip design layout data 102 is provided to an extraction module 105. The chip design layout data 102 of FIG. 2 is divided into a plurality of buckets 31 as shown in FIG. 3. It will be understood that, as used herein, a bucket refers to a zone or subregion of the chip. The buckets 31 of FIG. 3 are illustrated as an array of square buckets. However, the buckets need not be square, of the same size or arranged in a regular array.

Returning again to FIG. 2, the extraction module 105 extracts a layer for each bucket, as also shown at Block 14 of FIG. 1. A layer layout 107 is input to a guard band module 110 in FIG. 2, which obtains the design rules that are used, and determines a protection or guard band region considering, for example, the parasitic capacitance which may be generated when the integrated circuit is actually manufactured, as also shown at Block 16 of FIG. 1.

Figure 4:
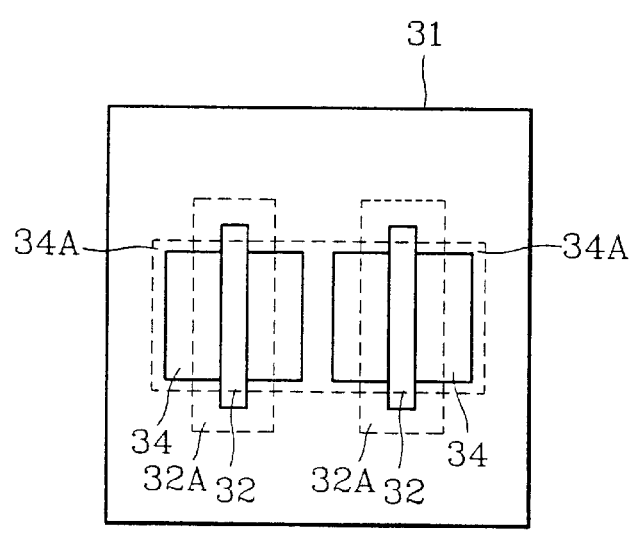
FIG. 4 is a top view of a bucket of FIG. 3, wherein guard bands are provided, according to embodiments of the present invention.
Figure 5:
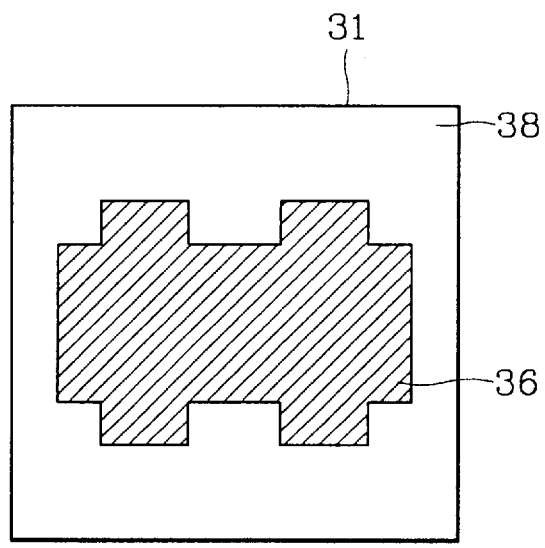
FIGS. 5 and 6 are top views of a bucket illustrating blocked regions in which dummy patterns are not formed and a dummy region in which dummy patterns can be formed, according to embodiments of the present invention.

FIG. 4 illustrates a diffusion layer 34 and a polysilicon layer 32. The guard band or protection region of the diffusion layer 34 is designated 34A, and the protection region or guard band of the polysilicon layer 32 is designated with 32A. Thus, the guard band module 110 of FIG. 2 generates a blocked region 112 of FIG. 2, wherein dummy patterns are not formed, as also shown at Block 18 of FIG. 1. FIG. 5 illustrates an example of a bucket 31 including a blocked region 36 and a dummy region 38.

Figure 6:
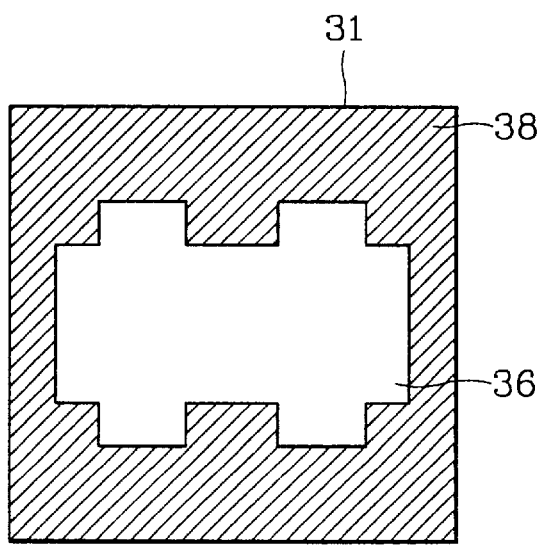

Referring again to FIGS. 1 and 2, an extraction module 115 of FIG. 2 inverts the blocked region 112 in each bucket, and extracts a dummy region 117 in which dummy patterns are to be arranged, as also shown at Block 20 of FIG. 1. FIG. 6 conceptually illustrates the inversion of the blocked region 36 and the dummy region 38 by the extraction module 115 of FIG. 2 and/or the dummy region forming Block 20 of FIG. 1.

Still referring to FIGS. 1 and 2, the layer layout 107 also is provided to a local pattern density calculating module 109, which calculates the ratio of the layer layout area to the area of each bucket region, and thereby calculates the local pattern density 123 of FIG. 2, as also shown at Block 19 of FIG. 1. The specifications (Blocks 23 and 121) of a dummy pattern that is designed or selected, for example, by a user using a rule file, and the target density (Blocks 25 and 122) of the integrated circuit design layout are input to a dummy pattern size calculating module 120 of FIG. 2 or Block 22 of FIG. 1, together with the area of the defined dummy pattern 117 and the local pattern density 123. The dummy pattern size-calculating module 120 (FIG. 2) or Block 22 (FIG. 1) adjusts the density of the dummy pattern for the respective bucket as a continuously variable function of the respective local pattern density 123 and the target density 25/122 for the region.

A dummy pattern specification may be used for the calculations of Blocks 22 and 120, which is selected from a plurality of dummy patterns that are stored in the dummy pattern specification 23/121. The specifications of the dummy pattern can include the maximum size and the minimum size of the dummy pattern, the pitch of the dummy pattern and the shape of the dummy pattern. For example, dummy pattern groups in which the dummy patterns are quadrangles, such as rectangles, are shown in FIGS. 8A–8C.

Figure 8A:
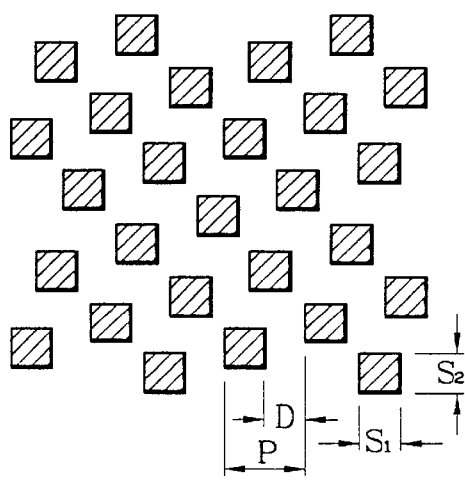
FIGS. 8A–8C, 9A–9C and 10A–10C show various dummy pattern groups which can be used, according to embodiments of the present invention.
Figure 8B:
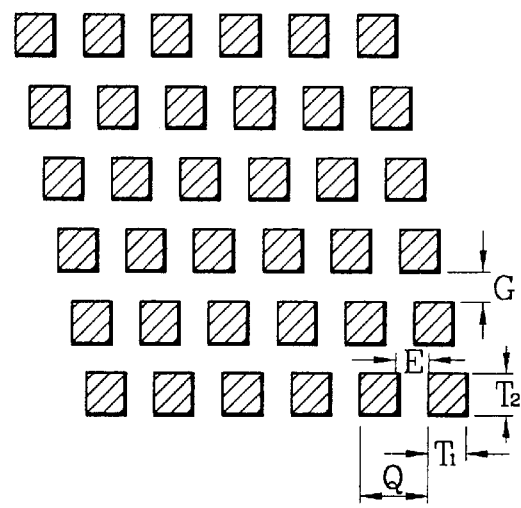
Figure 8C:
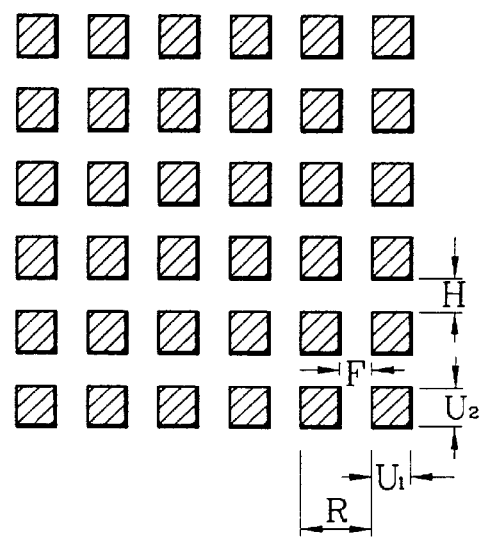

The pitches P, Q and R of the dummy patterns of FIGS. 8A–8C may be fixed in some embodiments of the present invention. Thus, in FIGS. 9A–9C and 10A–10C, the density of the dummy pattern group may be adjusted by adjusting the distances D, E and G, and F and H between the dummy patterns by increasing or reducing, respectively, the sizes S1, T1 and T2, and U1 and U2 of the dummy pattern. The density of the dummy pattern group thereby can be adjusted as a continuous variable.

Figure 7:
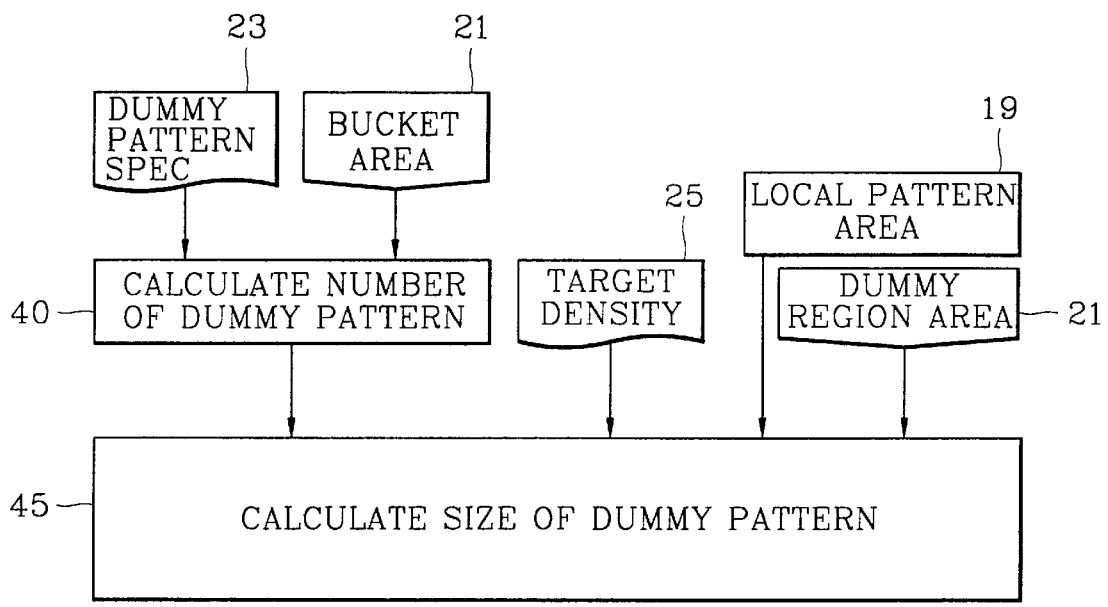
FIG. 7 is a block diagram of other embodiments for adjusting a size of a dummy pattern, according to embodiments of the present invention.

FIG. 7 is a block diagram illustrating details of adjusting the size of a dummy pattern according to embodiments of the invention which may correspond to Block 22 of FIG. 1 and/or Block 120 of FIG. 2. As shown in FIG. 7, the number of dummy patterns which can be arranged in a dummy pattern of a bucket is calculated using the dummy pattern specification 23 and the bucket area 21, at Block 40. The size of the dummy pattern is calculated using Equation (1) based on the number of dummy patterns 40, a target density 25, the local pattern area 19 of the bucket and the area of the dummy region 21. Equation (1) may be used when the dummy pattern is a rectangle and the lengths of two sides of the rectangle, which are perpendicular to each other, can be adjusted:

$$\{[\text{target density}-\text{design pattern density}]*\text{area of dummy region}]/ \text{number of dummy patterns}\}^{1/2} \quad (1)$$

Figure 9A:
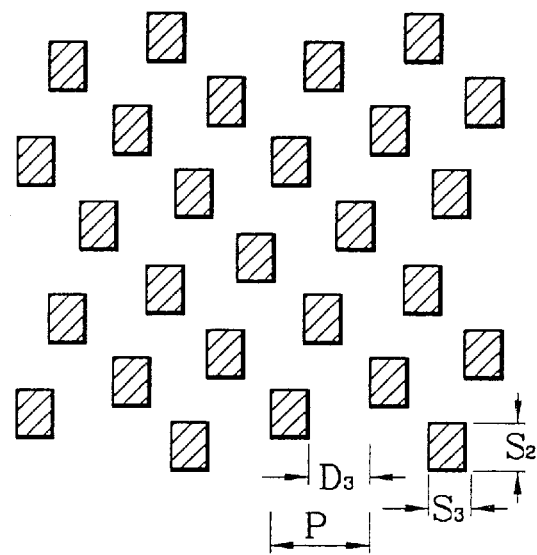
Figure 9B:
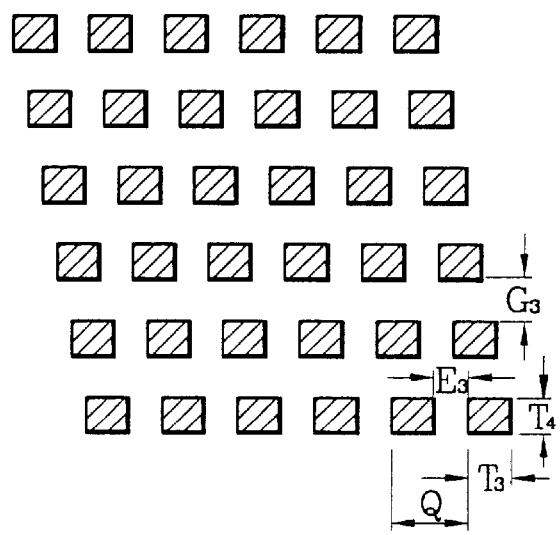
Figure 9C:
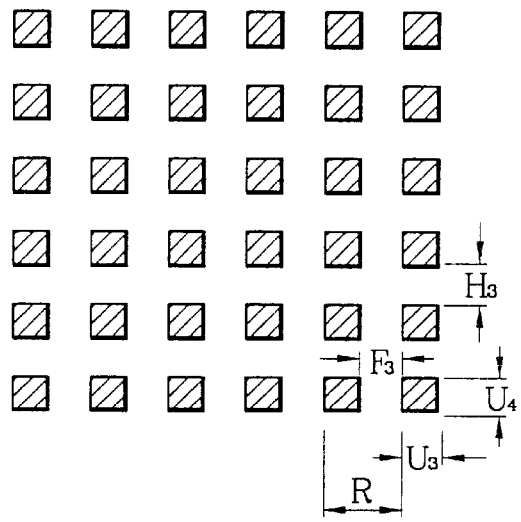
Figure 10A:
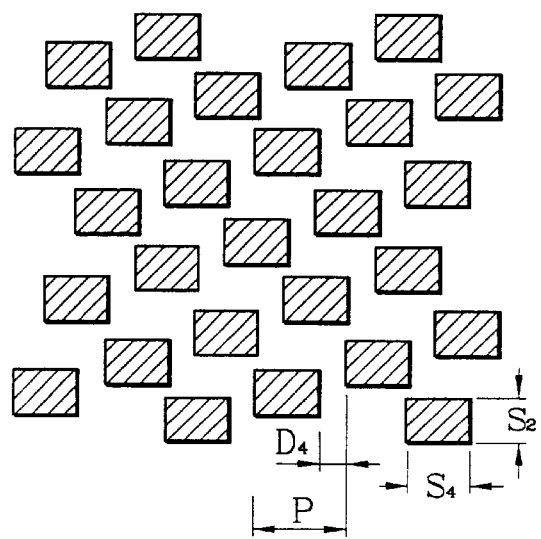
Figure 10B:
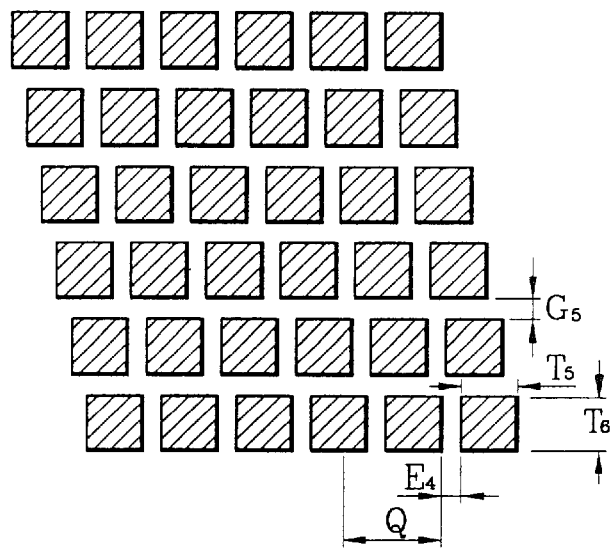
Figure 10C:
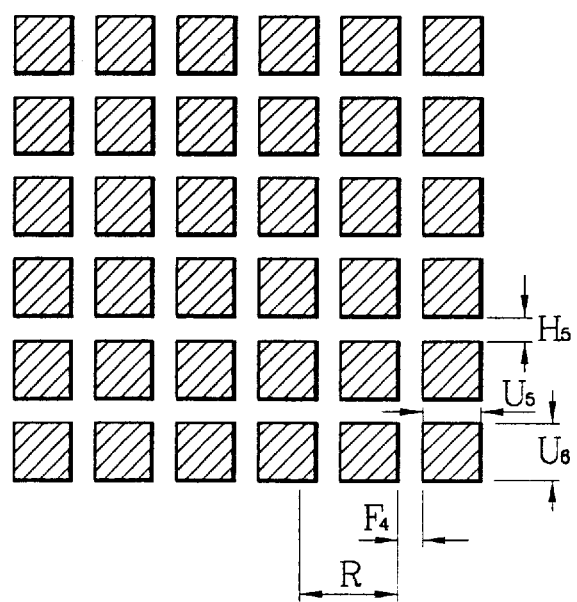

Qualitatively, when the difference between the target density and the local pattern density is small, the size of the dummy pattern may be reduced as a continuous function, as shown in FIGS. 9A–9C. Alternatively, when the difference between the target density and the local pattern density is large, the size of the dummy pattern may be increased as a continuous function, as shown in FIGS. 10A–10C.

Returning again to FIGS. 1 and 2, data 124 for the dummy pattern group that was adjusted as a continuously variable function of the respective pattern density and the target density for the region, is merged with the design layout data 102 by a merging module 130, which also may correspond to the operations of Block 26. Referring now to Block 28 of FIG. 1, if there are additional buckets being processed, operations return to Block 14 of FIG. 1 for that bucket. Alternatively, when the last bucket is processed at Block 28, a transform module 132 can generate mask data 135, which may correspond to the operations of Block 30 of FIG. 1. It will be understood that the data that is merged in Block 26 may be accumulated. That is, when the dummy pattern is added to a second bucket after adding the dummy pattern to a first bucket, the output of Block 26 becomes the chip design layout data where the dummy pattern has been added to the first bucket and to the second bucket.

The following examples are illustrative and shall not be construed as limiting the present invention.

EXAMPLE 1

Figure 11A:
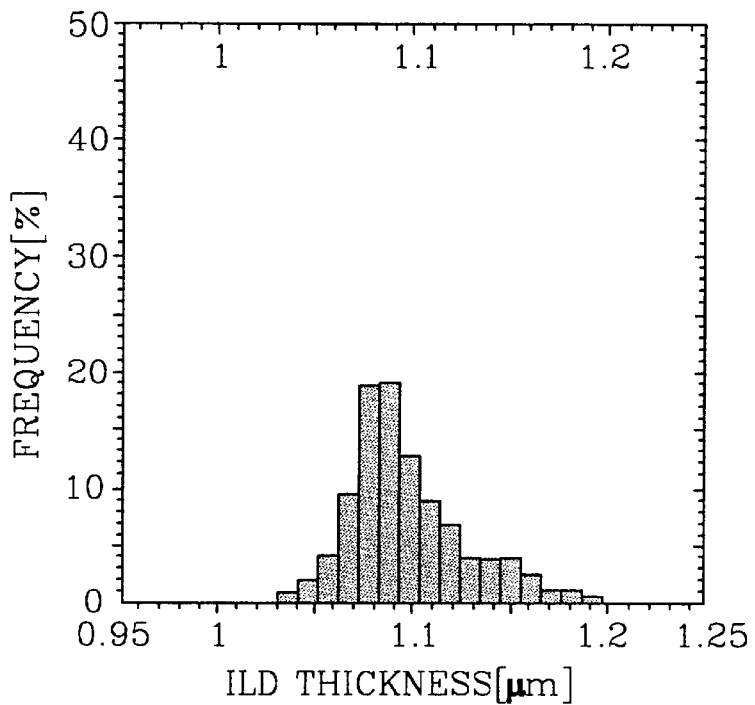
FIGS. 11A–11B are histograms of a distribution of the thickness of an interlayer dielectric film using conventional shape filling and using dummy patterns according to embodiments of the present invention, respectively.
Figure 11B:
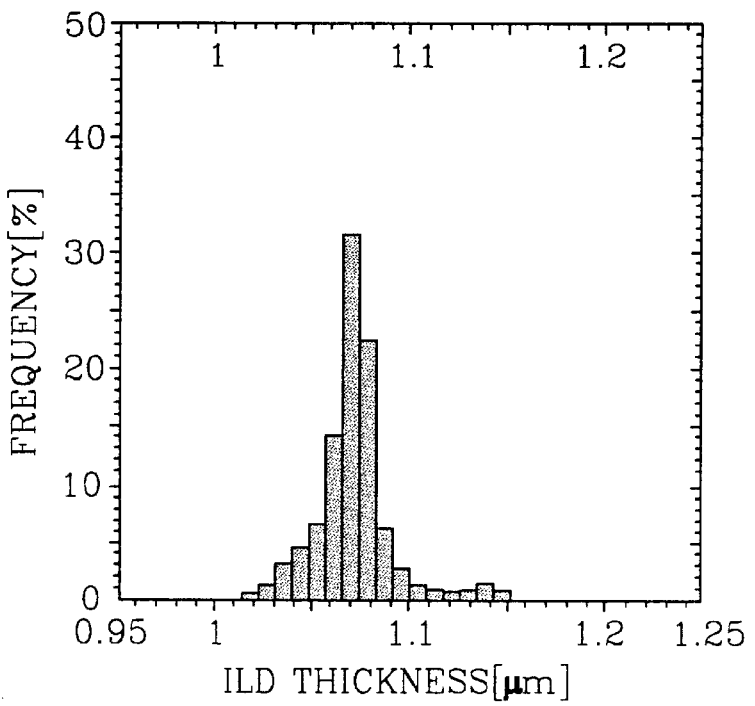

Data for a mask was generated using continuously variable dummy pattern densities according to embodiments of the present invention. A layer including the local pattern and the dummy region for each bucket was generated on an integrated circuit substrate, and an interlayer dielectric film was formed on the layer. The distribution of the thickness of the interlayer dielectric film then was investigated. In a second sample, conventional dummy patterns having the same size or density were formed without considering the local pattern density. FIG. 11A is a histogram of interlayer dielectric thickness for conventional uniform density dummy layers, and FIG. 11B is a histogram of interlayer dielectric thickness for continuously variable density dummy layers according to embodiments of the invention. The thickness deviation of the interlayer dielectric film is about 0.3 μm in FIG. 11A, whereas the thickness deviation of the interlayer dielectric film is about 0.2 μm in FIG. 11B, which is reduced by about 50%. Accordingly, embodiments of the invention can improve the uniformity of the thickness of the interlayer dielectric film.

EXAMPLE 2

Continuously variable density dummy layers according to embodiments of the present invention were generated for the metal layer of an Application-Specific Integrated Circuit (ASIC) device, including three million gates, and for the gate layer of a 16M Static Random Access Memory (SRAM). For the ASIC device, the size of the initial chip design layout before forming the dummy pattern was 104 MB.

When generating dummy pattern data using conventional technology, such as was described in the above-cited Eden et al. patent, after generating dummy pattern group data, the result may be stored in the same format as the initial integrated circuit design layout data. The design layout is then converted into mask data format. The initial design layout data format may use a conventional Graphical Design System (GDS) format. Unfortunately, the size of the changed chip layout design data file may increase from about several to about several tens of times or more compared to some embodiments of the present invention, where only the initial semiconductor chip design layout data file may be formatted when GDS formatted dummy pattern data is added to the GDS formatted and stored design data.

More specifically, when the dummy pattern data is generated, formatted in the same form as that of the initial integrated circuit design layout data and merged with the initial integrated circuit design layout data, and the merged integrated circuit design layout data is converted into mask data and the mask data is generated, using conventional dummy patterned generation systems, the size of the final mask data becomes 1000 MB, which is about a 9.6-fold increase. However, when some embodiments of the present invention are used, wherein the integrated circuit design layout data is only read once, for example at Block 12 of FIG. 1, the size of the mask data becomes 130 MB, which is only about a 1.3-fold increase. The time spent generating the mask data or the mask also can be reduced from about 19.2 hours to about 12 hours. At least part of this decrease may be due to the fact that the initial integrated circuit design layout data need not be read twice, when the local pattern density file of each bucket is generated and when the dummy patterns are generated. The design layout conventionally also may become gradually larger due to the application of an Optical Proximity Correction (OPC). The generation speed of mask data also may be reduced by reading the design layout data twice.

In the case of the SRAM, the size of the initial design layout data was 12 MB and the size of the mask data was 547 MB, which is a 45.6-fold increase after the dummy pattern data is generated, GDS formatted and merged with the initial design layout data, and the resultant merged data is converted into the mask data format. In contrast, according to some embodiments of the invention, the size of the mask data can be 102 MB, which is only about an 8.5-fold increase. Moreover, the time spent on generating the mask data for the mask may be reduced from about 11 hours to about 4 hours.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for generating dummy patterns for a region of an integrated circuit that is divided into a plurality of buckets, the method comprising:

obtaining a local pattern density for a respective bucket; and adjusting a density of a dummy pattern for the respective bucket as a continuously variable function of the respective local pattern density and a target density for the region.

2. A method according to claim 1 wherein the adjusting comprises adjusting a density of a dummy pattern for the respective bucket according to a formula in which the density of the dummy pattern is continuously variable.

3. A method according to claim 1 wherein the dummy pattern includes a plurality of features of fixed pitch and wherein the adjusting comprises increasing or decreasing a size of the features of fixed pitch as a continuously variable function of the respective local pattern density and a target density for the region.

4. A method according to claim 3 wherein the features of fixed pitch comprise quadrangles of fixed pitch and wherein the adjusting comprises increasing or decreasing a length of at least one side of the quadrangles of fixed pitch as a continuously variable function of the respective local pattern density and a target density for the region.

5. A method according to claim 4 wherein the features of fixed pitch comprise rectangles of fixed pitch and wherein the adjusting comprises increasing or decreasing a length of at least one side of the rectangles of fixed pitch as a continuously variable function of a square root of a difference between the respective local pattern density and the target density for the region, multiplied by an area of the dummy pattern in the respective bucket, divided by a number of dummy patterns in the respective bucket.

6. A method according to claim 1 wherein the obtaining is preceded by:

reading integrated circuit design layout data for the region of the integrated circuit from an integrated circuit design layout database;

dividing the integrated circuit design layout data for the region of the integrated circuit into the plurality of buckets;

calculating the local pattern density for a respective one of the buckets; and determining a dummy region for a respective one of the buckets.

7. A method according to claim 6 wherein the adjusting is followed by arranging the dummy pattern for the respective bucket, including the density that is a continuously variable function of the respective local pattern density and a target density for the region, in the dummy region for the respective one of the buckets.

8. A method according to claim 7 wherein the arranging comprises:
merging the dummy pattern for the respective bucket in the dummy region for the respective bucket, with the integrated circuit design layout data for the respective bucket; and
converting the dummy pattern and the integrated circuit design layout data for the plurality of buckets into mask data for patterning the region of the integrated circuit.

9. A method according to claim 6 wherein the determining comprises:
adding at least one guard band around the integrated circuit design layout data for the region of the integrated circuit in the respective buckets, to thereby define a blocked region in the respective buckets; and
defining the dummy region for a respective bucket as the respective bucket, except for the respective blocked region.

10. A method according to claim 1 wherein the adjusting is preceded by selecting a dummy pattern for the respective bucket from a plurality of dummy patterns and wherein the adjusting comprises adjusting a density of the dummy pattern for the respective bucket that is selected from the plurality of dummy patterns, as a continuously variable function of the respective local pattern density and a target density for the region.

11. A system for generating dummy patterns for a region of an integrated circuit that is divided into a plurality of buckets, the system comprising:
means for obtaining a local pattern density for a respective bucket; and
means for adjusting a density of a dummy pattern for the respective bucket as a continuously variable function of the respective local pattern density and a target density for the region.

12. A system according to claim 11 wherein the means for adjusting comprises means for adjusting a density of a dummy pattern for the respective bucket according to a formula in which the density of the dummy pattern is continuously variable.

13. A system according to claim 11 wherein the dummy pattern includes a plurality of features of fixed pitch and wherein the means for adjusting comprises means for increasing or decreasing a size of the features of fixed pitch as a continuously variable function of the respective local pattern density and a target density for the region.

14. A system according to claim 13 wherein the features of fixed pitch comprise quadrangles of fixed pitch and wherein the means for adjusting comprises means for increasing or decreasing a length of at least one side of the quadrangles of fixed pitch as a continuously variable function of the respective local pattern density and a target density for the region.

15. A system according to claim 14 wherein the features of fixed pitch comprise rectangles of fixed pitch and wherein the means for adjusting comprises means for increasing or decreasing a length of at least one side of the rectangles of fixed pitch as a continuously variable function of a square root of a difference between the respective local pattern density and the target density for the region, multiplied by an area of the dummy pattern in the respective bucket, divided by a number of dummy patterns in the respective bucket.

16. A system according to claim 11 further comprising:
means for reading integrated circuit design layout data for the region of the integrated circuit from an integrated circuit design layout database;
means for dividing the integrated circuit design layout data for the region of the integrated circuit into the plurality of buckets;
means for calculating the local pattern density for a respective one of the buckets; and
means for determining a dummy region for a respective one of the buckets.

17. A system according to claim 16 further comprising means for arranging the dummy pattern for the respective bucket, including the density that is a continuously variable function of the respective local pattern density and a target density for the region, in the dummy region for the respective one of the buckets.

18. A system according to claim 17 wherein the means for arranging comprises:
means for merging the dummy pattern for the respective bucket in the dummy region for the respective bucket, with the integrated circuit design layout data for the respective bucket; and
means for converting the dummy pattern and the integrated circuit design layout data for the plurality of buckets into mask data for patterning the region of the integrated circuit.

19. A system according to claim 16 wherein the means for determining comprises:
means for adding at least one guard band around the integrated circuit design layout data for the region of the integrated circuit in the respective buckets, to thereby define a blocked region in the respective buckets; and
means for defining the dummy region for a respective bucket as the respective bucket, except for the respective blocked region.

20. A system according to claim 11 further comprising means for selecting a dummy pattern for the respective bucket from a plurality of dummy patterns and wherein the means for adjusting comprises means for adjusting a density of the dummy pattern for the respective bucket that is selected from the plurality of dummy patterns, as a continuously variable function of the respective local pattern density and a target density for the region.

21. A computer program product for generating dummy patterns for a region of an integrated circuit that is divided into a plurality of buckets, the computer program product comprising a computer usable storage medium having computer-readable program code embodied in the medium, the computer-readable program code comprising:
computer-readable program code that is configured to obtain a local pattern density for a respective bucket; and
computer-readable program code that is configured to adjust a density of a dummy pattern for the respective bucket as a continuously variable function of the respective local pattern density and a target density for the region.

22. A computer program product according to claim 21 wherein the computer-readable program code that is configured to adjust comprises computer-readable program code that is configured to adjust a density of a dummy pattern for the respective bucket according to a formula in which the density of the dummy pattern is continuously variable.

23. A computer program product according to claim 21 wherein the dummy pattern includes a plurality of features of fixed pitch and wherein the computer-readable program code that is configured to adjust comprises computer-readable program code that is configured to increase or decrease a size of the features of fixed pitch as a continuously variable function of the respective local pattern density and a target density for the region.

24. A computer program product according to claim 23 wherein the features of fixed pitch comprise quadrangles of fixed pitch and wherein the computer-readable program code that is configured to adjust comprises computer-readable program code that is configured to increase or decrease a length of at least one side of the quadrangles of fixed pitch as a continuously variable function of the respective local pattern density and a target density for the region.

25. A computer program product according to claim 24 wherein the features of fixed pitch comprise rectangles of fixed pitch and wherein the computer-readable program code that is configured to adjust comprises computer-readable program code that is configured to increase or decrease a length of at least one side of the rectangles of fixed pitch as a continuously variable function of a square root of a difference between the respective local pattern density and the target density for the region, multiplied by an area of the dummy pattern in the respective bucket, divided by a number of dummy patterns in the respective bucket.

26. A computer program product according to claim 21 further comprising:
   computer-readable program code that is configured to read integrated circuit design layout data for the region of the integrated circuit from an integrated circuit design layout database;
   computer-readable program code that is configured to divide the integrated circuit design layout data for the region of the integrated circuit into the plurality of buckets;
   computer-readable program code that is configured to calculate the local pattern density for a respective one of the buckets; and
   computer-readable program code that is configured to determine a dummy region for a respective one of the buckets.

27. A computer program product according to claim 26 further comprising computer-readable program code that is configured to arrange the dummy pattern for the respective bucket, including the density that is a continuously variable function of the respective local pattern density and a target density for the region, in the dummy region for the respective one of the buckets.

28. A computer program product according to claim 27 wherein the computer-readable program code that is configured to arrange comprises:
   computer-readable program code that is configured to merge the dummy pattern for the respective bucket in the dummy region for the respective bucket, with the integrated circuit design layout data for the respective bucket; and
   computer-readable program code that is configured to convert the dummy pattern and the integrated circuit design layout data for the plurality of buckets into mask data for patterning the region of the integrated circuit.

29. A computer program product according to claim 26 wherein the computer-readable program code that is configured to determine comprises:
   computer-readable program code that is configured to add at least one guard band around the integrated circuit design layout data for the region of the integrated circuit in the respective buckets, to thereby define a blocked region in the respective buckets; and
   computer-readable program code that is configured to define the dummy region for a respective bucket as the respective bucket, except for the respective blocked region.

30. A computer program product according to claim 21 further comprising computer-readable program code that is configured to select a dummy pattern for the respective bucket from a plurality of dummy patterns and wherein the computer-readable program code that is configured to adjust comprises computer-readable program code that is configured to adjust a density of the dummy pattern for the respective bucket that is selected from the plurality of dummy patterns, as a continuously variable function of the respective local pattern density and a target density for the region.

* * * * *